United States Patent [19]

Chou et al.

[11] Patent Number: 5,455,064

[45] Date of Patent: Oct. 3, 1995

[54] PROCESS FOR FABRICATING A SUBSTRATE WITH THIN FILM CAPACITOR AND INSULATING PLUG

[75] Inventors: William T. Chou, Cupertino; Michael G. Peters, Santa Clara; Wen-chou V. Wang, Cupertino; Richard L. Wheeler, San Jose, all of Calif.

[73] Assignee: Fujitsu Limited, Japan

[21] Appl. No.: 151,409

[22] Filed: Nov. 12, 1993

[51] Int. Cl.$^6$ ........................................ B05D 5/12
[52] U.S. Cl. .................. 427/79; 427/97; 427/404; 427/419.2
[58] Field of Search ................ 427/79, 97, 404, 427/419.2

[56] References Cited

U.S. PATENT DOCUMENTS

| | | | |
|---|---|---|---|
| 4,549,927 | 10/1985 | Goth et al. | 156/643 |
| 4,704,368 | 11/1987 | Goth et al. | 437/60 |
| 4,731,695 | 3/1988 | Brown et al. | 361/313 |
| 5,113,314 | 5/1992 | Wheeler et al. | 361/384 |
| 5,323,520 | 6/1994 | Peters et al. | 29/25.42 |
| 5,334,804 | 8/1994 | Love et al. | 174/267 |

Primary Examiner—Shrive Beck
Assistant Examiner—Benjamin L. Utech
Attorney, Agent, or Firm—Christie, Parker & Hale

[57] ABSTRACT

A thin-film bypass capacitor is fabricated by forming a plurality of through holes through the thickness of a non-conductive base substrate and filling the through holes with a conductive material to form ground vias and power vias. A sequence of back side metalization layers are applied to the back side surface of the base substrate. A sequence of bottom contact layers are applied to the front side surface of the base substrate. A bottom contact power terminal is formed in the bottom contact layer and is electrically isolated from remaining portions of the bottom contact layers by insulating plugs. A bottom contact metalization layer is applied to the surface of the bottom contact layers and the insulating plugs. A dielectric layer is formed on the surface of the bottom contact metalization layer. A ground metalization via and a power metalization via are formed at the surface of the dielectric layer. A sequence of top contact layers are applied to the surface of the dielectric layer and a front side ground terminal and front side power terminal are formed. A back side ground terminal and a back side power terminal are formed at the back side of the base substrate.

4 Claims, 11 Drawing Sheets

PROCESS FOR FABRICATING A SUBSTRATE WITH THIN FILM CAPACITOR AND INSULATING PLUG

FIELD OF THE INVENTION

The present invention relates generally to the fabrication of substrates having bypass capacitors. In particular, the present invention provides bypass capacitors in close proximity to integrated circuits.

BACKGROUND OF THE INVENTION

In electronic circuits, bypass capacitors provide impedance paths for alternating currents so that the high frequency alternating currents are not transmitted to selected portions of the electronic circuit. On printed circuit boards, various types of discrete electrical components having various configurations and electrical connection arrangements have been employed as bypass capacitors.

For example, a discrete capacitor well known in the art is the axial lead capacitor which is cylindrical in shape and has an electrical lead extending from each of the flat ends of the cylinder. Axial lead capacitors are typically installed on the printed circuit board by bending the leads away from the capacitor so that when the capacitor is placed on the circuit board along its longitudinal side, the leads make contact, either by feed through or surface mount, with corresponding circuit traces etched on the printed circuit board.

A second type of capacitor well known in the art is the tombstone capacitor which is configured in the shape of a box having electrical leads extending from only one of the faces of the box. Like the axial capacitor, the leads of the tombstone capacitor must also be bent in order to make contact with circuit traces on the circuit board.

The third type of capacitor known in the art is a leadless capacitor used for surface mounting to a printed circuit board. The leadless capacitor is configured in the shape of a box having electrical contacts disposed on one face of the box. The leadless capacitor is electrically connected to the printed circuit board by soldering each electrical contact of the capacitor to a respective circuit trace on the printed circuit board.

Since high performance electronics operate at increasing frequencies, it becomes necessary to include the capacitance of both the circuit traces on the printed circuit board and electrical leads of the capacitors when designing an electronic circuit. In order to avoid or minimize the capacitance effects of the capacitor leads, the circuit designer will seek to place the bypass capacitors employed in the circuit as close as possible to the corresponding integrated circuit package. However, as the frequency of operation of the electronic circuits increases, the circuit designer also attempts to place the integrated circuit packages as close together as possible on the printed circuit board. Thus, in the design and manufacturing of the electrical circuit, both the bypass capacitors and the integrated circuit packages compete with each other for placement close to other integrated circuit packages on the printed circuit board.

Consequently, in order to accommodate the need to both reduce undesired circuit capacitance due to capacitor leads and use space more efficiently, circuit designers have elected to incorporate bypass capacitors into the printed circuit board itself. The design of such a bypass capacitor avoids need for electrical leads and, therefore, eliminates the undesired contribution of capacitance inherent with such leads. In effect, the leads are part of the capacitor. Additionally, the design of such a bypass capacitor, built as an integral member of the printed circuit board, facilitates the efficient use of space in designing an electrical circuit.

However, the advent of high performance computers has also created a greater need for high density conductors within the printed circuit board without an increase in the complexity and cost of manufacturing. Thus, in a manner similar to the competition for space for components mounted on the surface of the printed wiring board (i.e., integrated circuits and capacitors), bypass capacitors fabricated as integral printed circuit board components also compete for space with the high density conductors within the printed circuit board itself.

Accordingly, the need exists for a capacitor that is both small in size to permit its use in high performance computers and is configured having electrical connectors that do not contribute significantly to the capacitance of the capacitor. Unfortunately, the basic construction of a capacitor, comprising conductive members electrically separated by a nonconductive layer, inherently limits the ability to reduce the size of capacitor. This is due to electrical short circuits that may occur between conductive members due to the particular thickness of the nonconductive layer and/or particular configuration of the conductive members. For example, electrical shorts in capacitors made from thin films of conductive materials electrically separated by a dielectric layer are known to be caused at interfaces between the conductive members and the dielectric layer where there exists sharply deflecting topography.

It is, therefore, desirable that a bypass capacitor be fabricated in such a manner that will facilitate its spatially efficient use with a printed circuit board comprising numerous integrated circuits. It is desirable that the bypass capacitor be fabricated in such a manner that will minimize the undesired capacitance contribution associated with the means used to electrically connect the capacitor to a printed circuit. It is desirable that the capacitor be fabricated in a manner that minimizes the potential for electrical shorts between conductive members forming the capacitor. It is also desirable that the method of manufacturing the bypass capacitor, as well as the materials used, be both practical and economically feasible.

SUMMARY OF THE INVENTION

There is, therefore, provided in the practice of this invention according to a presently preferred embodiment, a method for fabricating a thin-film bypass capacitor configured to interconnect with integrated circuits and printed circuit boards in a spatially efficient manner that both minimizes any undesirable capacitance contribution from the capacitor's electrical connections, and minimizes the potential for electrical shorts between the conductive members forming the capacitor. The thin-film bypass capacitor is fabricated by forming a plurality of through holes through the thickness of a nonconductive substrate and filling the through holes with a conductive metal to form a number of ground vias and power vias. A sequence of back side metalization layers comprising a back side adhesion layer, a back side conductive layer, and a back side metal layer are applied to the back side surface of the base substrate and are electrically connected to the ground and power vias. A back side ground terminal, located adjacent to a ground via, and a back side power terminal, located adjacent to a power via, are formed by selectively removing portions of the backside metalization layers.

A sequence of bottom contact layers comprising a bottom contact adhesion layer, a bottom contact conductive layer, and a bottom contact metal layer are applied to the front side surface of the base substrate. Selected portions of the bottom contact layers are removed forming bottom contact power terminals located adjacent to each power via. A dielectric material is used to fill in the removed portions of the bottom contact layers, forming insulating plugs that encapsulate and electrically isolate the bottom contact power terminals from the remaining portions of the bottom contact layers. A bottom contact metalization layer is deposited onto the surface of both the bottom contact conductive layer and the insulating plugs and is selectively removed from the surface of each insulating plug.

A dielectric layer comprising a electrically nonconductive material is formed on the surface of both the bottom contact metalization layer and the insulating plugs. The dielectric layer, in conjunction with the insulating plugs, serve to electrically isolate the bottom contact layers from the top contact layers, thereby forming the bypass capacitor. Portions of the bottom contact metalization layer are exposed to form ground metalization vias, located adjacent to the ground vias, and power metalization vias, located adjacent to the power vias.

A sequence of top contact layers comprising a top contact adhesion layer, a top contact conductive layer, and a top contact metal layer are deposited onto the surface of the dielectric layer. Portions of the top contact layer are removed to form front side ground terminal, located adjacent to the ground vias, and front side power terminals, located adjacent to the power vias. Each front side ground terminal is electrically connected with a back side ground terminal through the top contact layers, a ground metalization via, the bottom contact layers, and a ground via. Similarly, each front side power terminal is electrically connected with a back side power terminal through the top contact layers, a power metalization via, the bottom contact power terminal, and a power via.

The capacitor according to this invention is formed by the arrangement of the bottom contact layers, dielectric layer, insulating plugs, and the top contact layers. The dielectric substrate, ground and power vias, and the backside ground and power terminals serve to promote connection with other electrical components and permit transfer of electrical power from such components to the capacitor.

The thin-film capacitor fabricated in this manner permits the storage of electrical energy in a configuration that can interconnect with integrated circuits and printed circuit boards in a spatially efficient manner. The electrical contacts of the bypass capacitor are defined by the thickness of the capacitor itself which minimizes any undesirable capacitance contribution associated with the capacitor's electrical leads. Further, the use of the insulating plugs to isolate each bottom contact power terminal minimizes the potential for electrical short circuits developing between the bottom contact layers and top contact layers due to their sharp corners.

BRIEF DESCRIPTION OF THE DRAWINGS

These and other features and advantages of the present invention will become appreciated as the same becomes better understood with reference to the specification, claims and drawings wherein:

FIG. 3 is a cross sectional view of the thin-film bypass capacitor substrate after through holes have been formed in the dielectric substrate and metalized;

FIG. 4 is a cross sectional view of the thin-film bypass capacitor substrate after the back side has been metalized to form a back side metalization layer;

FIG. 5 is a cross sectional view of the thin-film bypass capacitor substrate after the front side has been metalized to form a bottom contact layer;

FIG. 6 is a cross sectional view of the thin-film bypass capacitor substrate after the bottom contact power terminal has been formed;

FIG. 7 is a cross sectional view of the thin-film bypass capacitor substrate after the formation of insulator plugs, deposition of a bottom contact metalization layer, and removal of selective portions of the bottom contact metalization layer;

FIG. 8 is a cross sectional view of the thin-film bypass capacitor substrate after the formation of a layer of dielectric material;

FIG. 9 is a cross sectional view of the thin-film bypass capacitor substrate after the application of a top contact layer;

FIG. 10 is a cross sectional view of the thin-film bypass capacitor substrate after the formation of a front side ground terminal and a front side power terminal;

FIG. 11 is a cross sectional view of the thin-film bypass capacitor substrate after the formation of a back side ground terminal and a back side power terminal.

DETAILED DESCRIPTION

Figure 1:
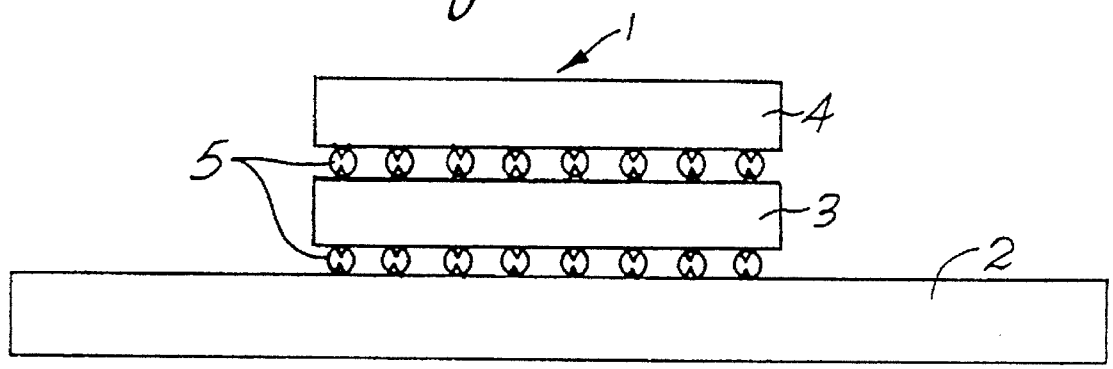
FIG. 1 is a side view of a multi-chip module using a thin-film bypass capacitor manufactured according to principles of the invention.

In its most basic form, a capacitor comprises a pair of electrically conductive plates or conductors that are separated by a nonconductive dielectric material. FIG. 1 shows an exaggerated side view of a multi-chip module using a thin-film bypass capacitor manufactured according to principles of the invention. A multi-chip module (MCM) 1 comprises a printed circuit board 2 for providing electrical current to an integrated circuit 4. A thin-film bypass capacitor 3 is used to alter the flow of electrical current from the printed circuit board 2 to the integrated circuit 4.

The top surface of the thin-film bypass capacitor is directed toward a mating surface of the integrated circuit 4 and the bottom surface of the thin-film bypass capacitor is opposite to the top surface and directed toward a mating surface of the printed circuit board 2. The top surface of the thin-film bypass capacitor comprises a plurality of power and ground terminals that are connected to respective power and ground terminals of the integrated circuit by contact pads 5. Similarly, the bottom surface of the thin-film bypass capacitor comprises a plurality of power and ground terminals that are connected to respective power and ground terminals of the printed circuit board by contact pads 5. The contact pads preferably comprise a conductive solder material that when melted flows to create an electrical connection between the thin-film bypass capacitor terminals and the corresponding terminals of both the integrated circuit and the printed circuit board.

The terminology "ground" or "power" terminals used to refer to the electrical connections of the capacitor is used purely as a matter of convenience. The electrical connections could be referred to as an "emitter" and "collector" in the context of a bipolar transistor or as a "source" and "drain" in the context of a field effect transmitter. Additionally, the thin-film capacitor manufactured according to principles of the invention may comprise a plurality of such power and ground terminals on both the front side and back side of each capacitor plate. The terms "top", "bottom", "front" and "back, are also used herein for ease of explanation and not as structural or orientation limitations. The thin-film capacitor may be configured in the shape of a strip, rectangle and the like.

Figure 2:
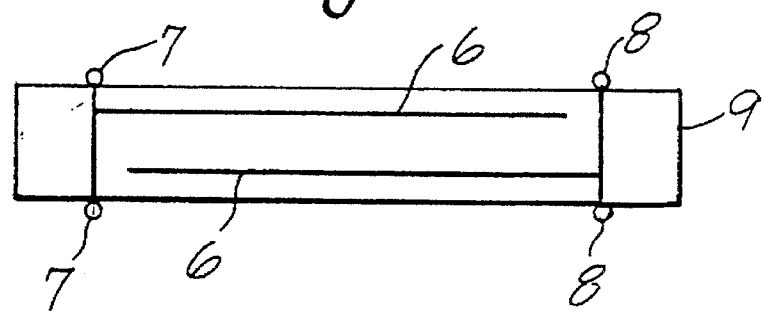
FIG. 2 is a electrical diagram of an embodiment of the thin-film bypass capacitor.

The thin-film capacitor according to practice of this invention can also be represented in the form of an electrical diagram as show in FIG. 2. The electrical diagram shows the basic configuration of the capacitor comprising a pair of conductive plates 6, each plate being connected to either a pair of ground electrical terminals 7 or power electrical terminals 8. A dielectric substrate 9 encloses and separates the pair of conductive plates to form the capacitor.

Figure 3:
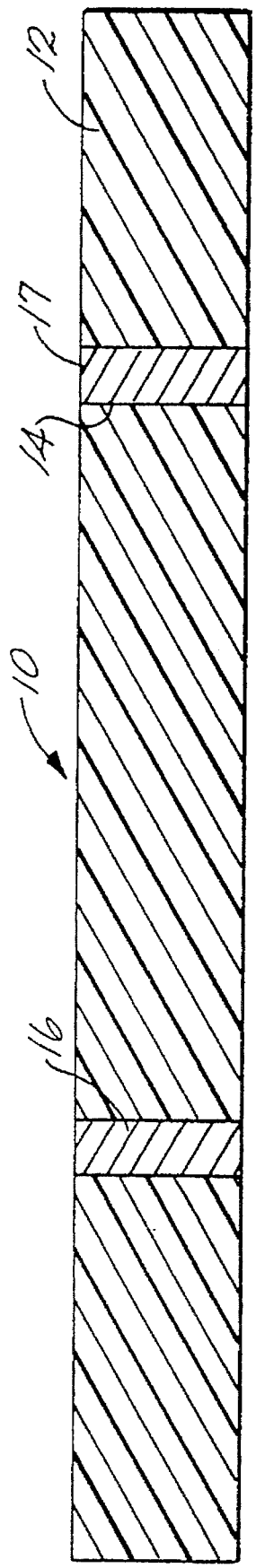
FIGS. 3 through 11 are schematic cross sectional views of an embodiment of the thin-film bypass capacitor substrate after each of a succession of process steps used to manufacture the bypass capacitor according to the practice of this invention, in each of these figures the layer thicknesses and lateral distances are exaggerated for purpose of illustration.

FIG. 3 shows an exaggerated cross sectional view of a bypass capacitor substrate 10 with electrical throughhole interconnects according to principles of this invention. The bypass capacitor substrate 10 comprises a base substrate 12 made of a non-conductive material. The nonconductive material selected for the construction of the substrate must have the mechanical and electrical properties desired for use as a substrate ford capacitor. Suitable nonconductive materials may include organic or inorganic polymers, silicon, ceramics, glass, glassceramics, polyimide-epoxy, epoxy-fiberglass, Teflon and the like.

The base substrate 12 has a plurality of through holes 14 extending through its thickness, defined as the distance between a first surface of the base substrate and a second surface of the base substrate opposite to first surface. For purposes of reference, the first surface of the base substrate will be referred to as the front side at the top of FIG. 3, and the second surface will be referred to as the back side at the bottom of FIG. 3. This convention for referencing the first and second surfaces of the base substrate will remain constant throughout the description of the invention as illustrated by FIGS. 3 through 11. It will also be recognized that the cross sections illustrated may be only a small fraction of a large substrate having many components and features not needed for an explanation of this invention. Additionally, it should be noted that the figures referred to represent exaggerated cross sectional views of the thin-film capacitor for purposes of clarity.

The through holes 14 may be formed in the base substrate by methods which are well known to those skilled in the art. For example, the through holes may be laser drilled, punched, or etched using reactive ion, dry, chemical, or photo-litho-graphic etching techniques. The through holes 14 are filled with an electrically conductive material to form a ground via 16 and a power via 17. The conductive material selected to fill or metalize the through hole may include metals, alloys of metal, metal-nonmetal compositions and the like. The through hole may be metalized by using deposition techniques well known to those skilled in the art such as sputter deposition, chemical vapor deposition, plasma deposition, electroplating, metal organic chemical vapor deposition and the like.

Figure 4:
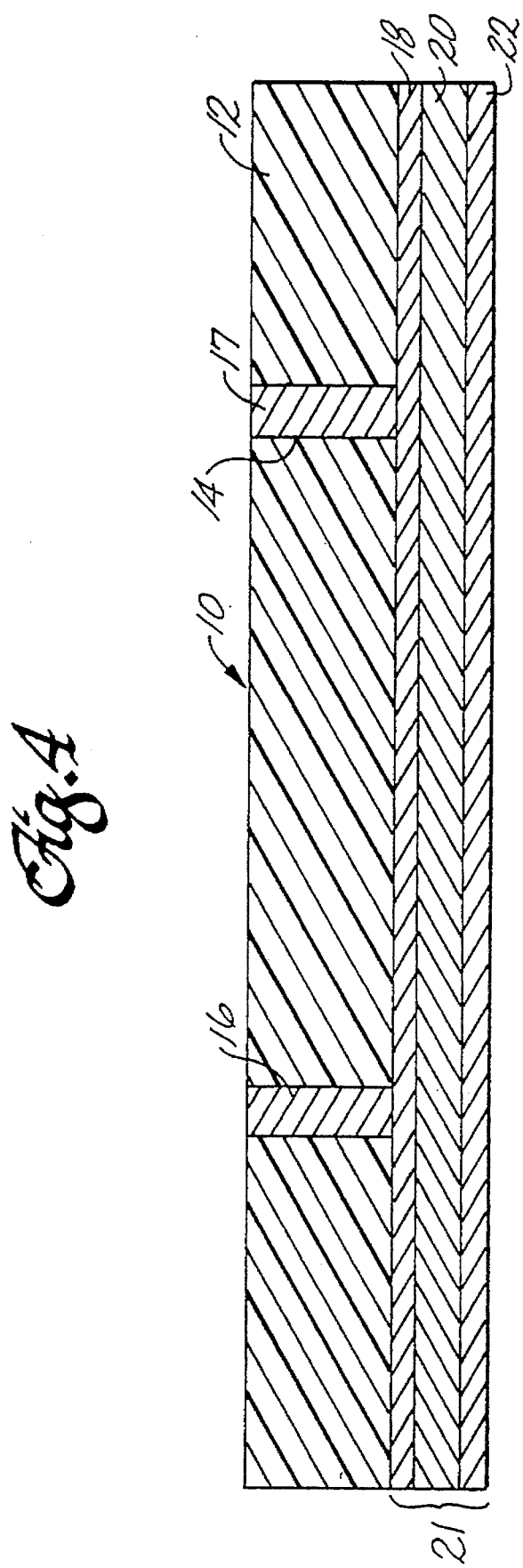

FIG. 4 shows the bypass capacitor substrate with back side metalization layers 21. The back side surface of the dielectric substrate is metalized for the purpose of providing a back side ground terminal 62 and a back side power terminal 64 (FIG. 11) that will serve to electrically connect the bypass capacitor to a printed circuit board or the like.

The back side metalization layers 21 comprise a back side adhesion layer 18, a back side conductive layer 20, and a back side metal layer 22. The back side surface of the base substrate 12 is cleaned in a manner well known to those skilled in the art to prepare the substrate for the metalization process. A back side adhesion layer 18 is deposited onto the back side surface of the base substrate 12 by methods well known to those skilled in the art such as by sputter deposition, chemical vapor deposition, plasma deposition, electroplating and the like. A preferred method is by sputter deposition. The material chosen to serve as the back side adhesion layer should be capable of forming a good bond with the material chosen to form the back side conductive layer 20. For example, if the back side conductive layer comprises copper, suitable materials for the back side adhesion layer material may include chromium and titanium. A preferred back side adhesion material is chromium. A preferred back side adhesion layer 18 has a thickness of approximately 0.02 micrometers.

A backside conductive layer 20 is deposited onto the surface of the back side adhesion layer 18 using deposition techniques similar to those used for depositing the back side adhesion layer 18. A preferred method is by sputter deposition. The material chosen for the back side conductive layer should be a good electrical conductor (i.e., have a low resistivity value) and may include metals, metal alloys and the like. A preferred material for the back side conductive layer is copper. The thickness of the back side conducive layer 20 is designed according to particular electrical requirements for the circuit and capacitor substrate 10. A preferred back side conductive layer has a thickness of approximately one micrometer.

However, the back side conductive layer may be applied by using a two-step deposition technique if, according to the electrical requirements for the capacitor substrate, the thickness of the back side conductive copper needs to be greater than about two micrometers. In such a case, the back side conductive layer is deposited by first sputtering a thin seed layer of less than about two micrometers on to the surface of the back side adhesion layer and then electroplating the conductive material onto the surface of the seed layer until the desired back side conductive layer thickness is achieved.

A back side metal layer 22 is deposited onto the surface of the back side conductive layer 20 by using deposition techniques similar to those described for depositing both the back side adhesion layer and back side conductive layer. Like the back side adhesion layer 18, the material chosen for the back side metal layer should be one that forms an intimate interface with the back side conductive layer 20. If the back side conductive layer is copper, suitable materials for the back side metal layer material may include chromium and titanium. A preferred back side metal material is chromium. A preferred back side metal layer has a thickness of approximately 0.02 micrometers. The purpose of the back side metal layer 22 is to protect the back side conductive layer from delaminating away from the back side adhesion layer when the back side metalization layers 21 undergo a subsequent etching operation.

Alternatively, the back side adhesion layer 18, the back side conductive layer 20, and the back side metal layer 22 may comprise a single layer of one material (i.e., metal or metal alloy) having characteristics of electrical conductivity similar to that of the multi-layer embodiment. However, such a mono-layer embodiment may not be usable when copper is chosen for the back side conductive layer. The use of copper for the back side conductive layer makes the use of an adhesion layer important because the copper does not adhere well to the dielectric substrate 12. Further, the use of copper also calls for the use of a back side metal layer to protect it from being removed during a subsequent step of selectively etching the back side metalization layer 21.

Figure 5:
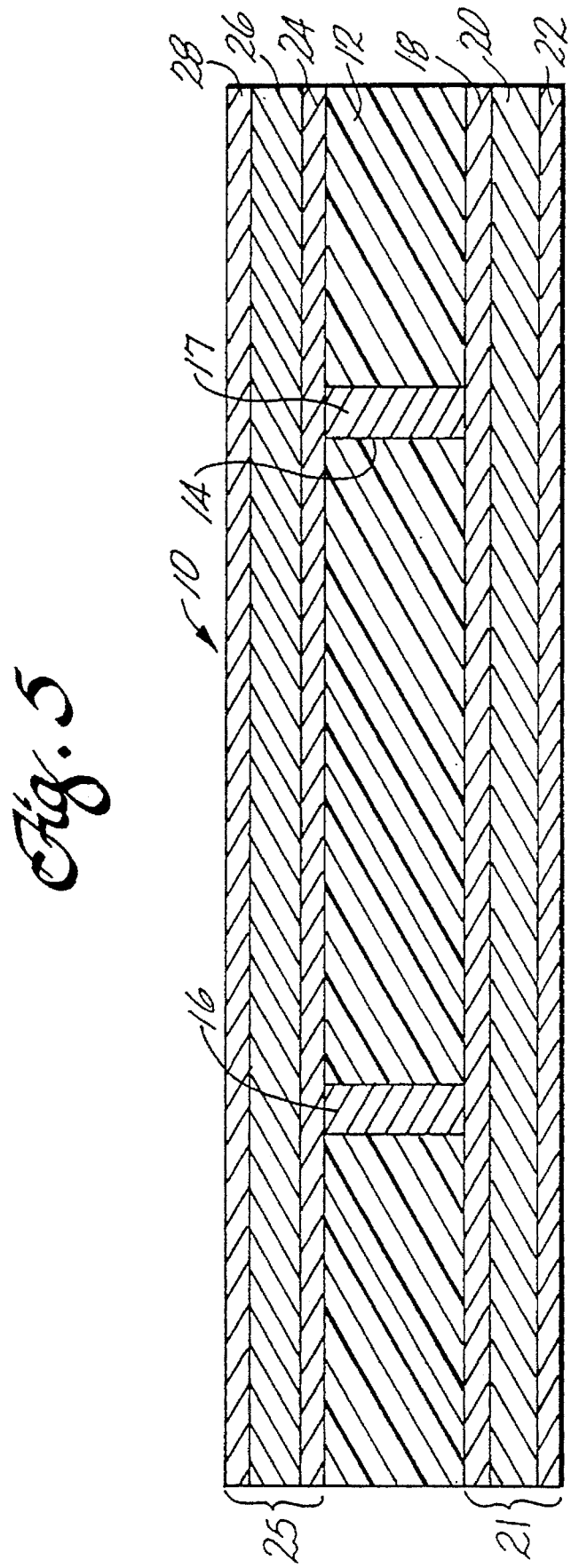
Figure 8:
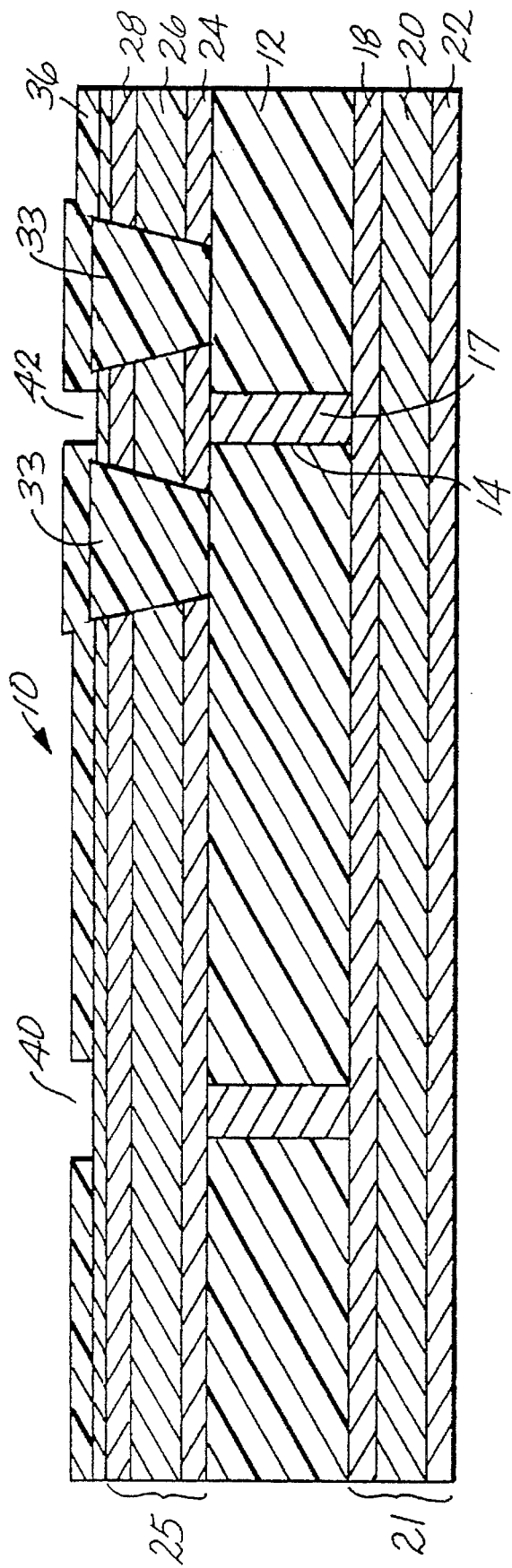
Figure 9:
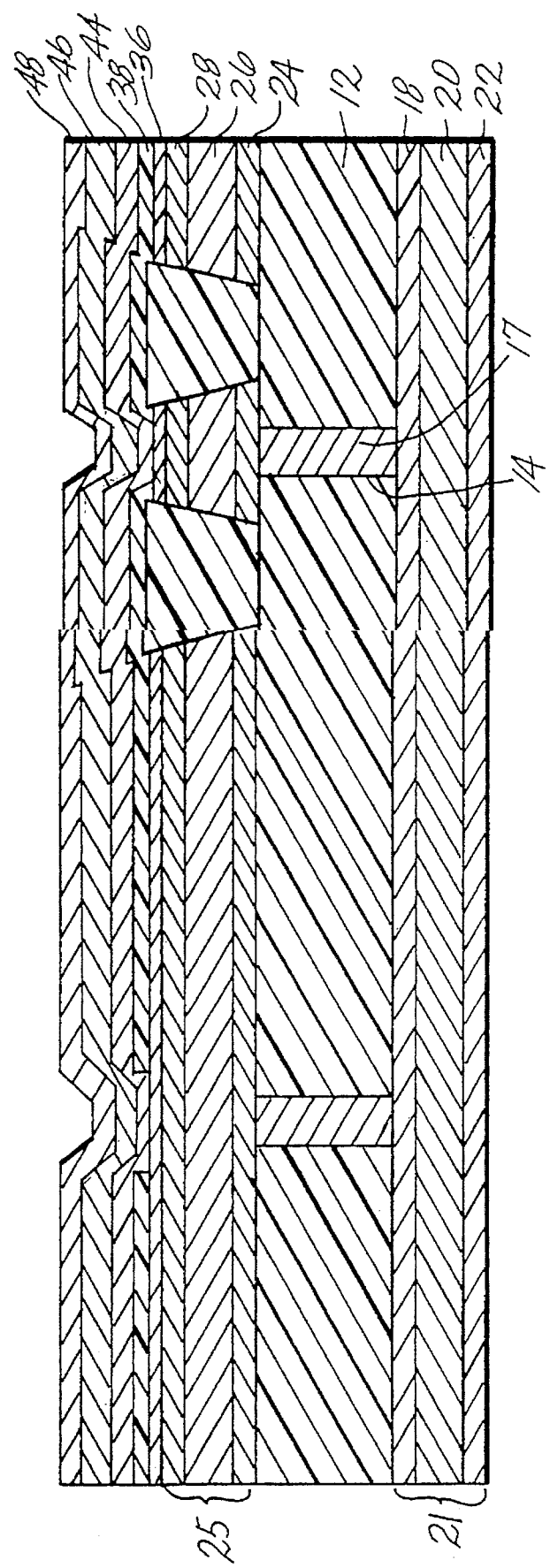
Figure 10:
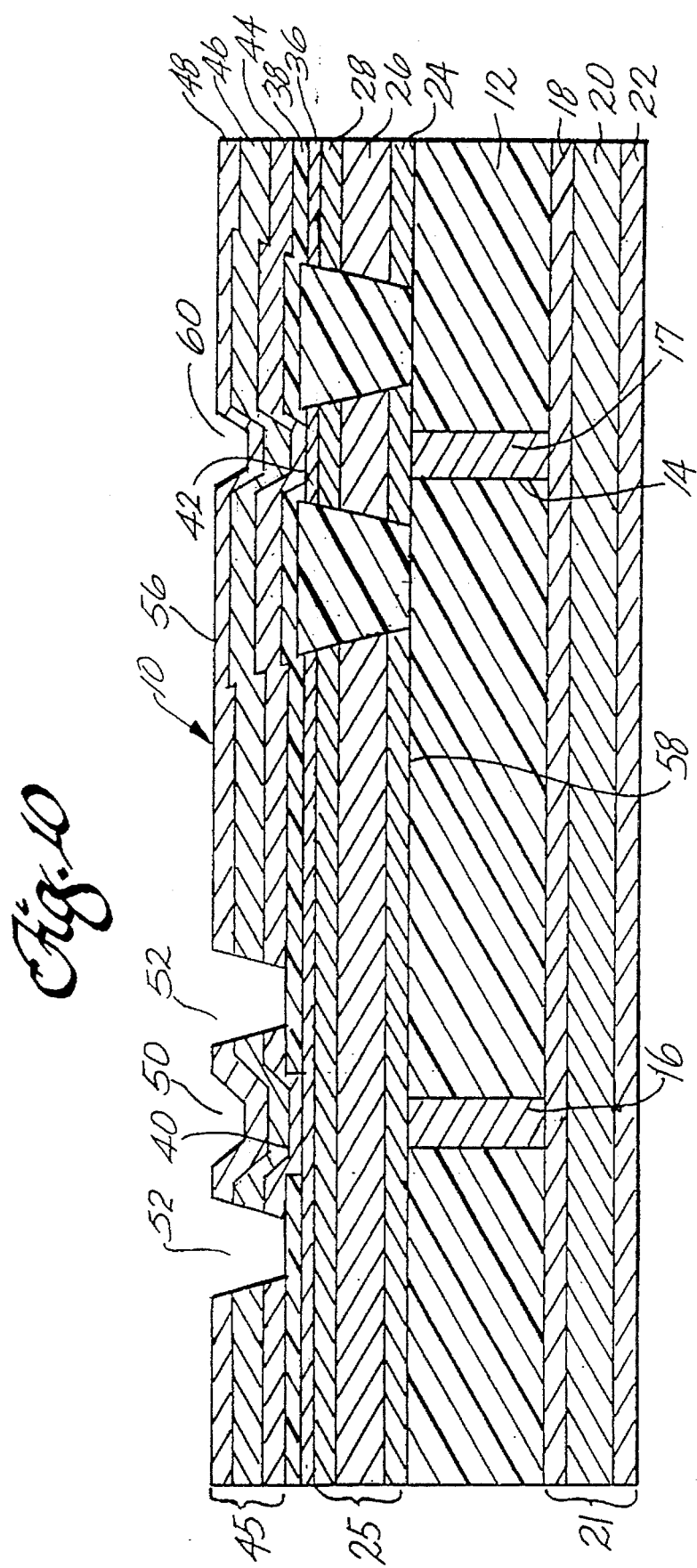

FIG. 5 shows the bypass capacitor substrate 10 after the front side surface of the dielectric substrate 12 has been metalized. As a matter of terminology, the layers of conductive material that are first metalized onto the front side surface of the base substrate 12 are referred to as bottom contact layers 25. The front side of the capacitor substrate 10 will comprise two separate electrically conductive layers, a bottom contact layer 25 and a top contact layer 45 (FIGS. 8 through 10). The bottom and top contact layers each comprise a series of metalization layers and are electrically isolated from each other by an insulating dielectric layer 38. The bottom and top contact layers form the pair of electrically conductive plates needed to make up the thin-film bypass capacitor.

The top surface of the base substrate 12 is cleaned by using the same technique used for cleaning and preparing the back side surface of the base substrate prior to backside metalization. The bottom contact layer 25 comprises a bottom contact adhesion layer 24, a bottom contact conductive layer 26 and a bottom contact metal layer 28. A bottom contact adhesion layer 24 is deposited onto the front side surface of the base substrate using a deposition technique similar to that described for depositing the back side adhesion layer 18 onto the back side surface of the base substrate. Preferably, the bottom contact adhesion layer is deposited by sputter deposition. The materials chosen for the bottom contact adhesion layer are the same as those chosen for the back side adhesion layer 18. A preferred bottom contact adhesion layer is chromium. A preferred bottom contact adhesion layer 24 has a thickness of approximately 0.02 micrometers.

A bottom contact conductive layer 26 is deposited onto the surface of the bottom contact adhesion layer 24 by deposition techniques similar to that described for depositing the back side conductive layer 20 onto the back side adhesion layer 18. Preferably, the bottom contact conductive layer is deposited by sputter deposition. The materials chosen for the bottom contact conductive layer are the same as those chosen for the back side conductive layer 20. A preferred bottom contact conductive layer is copper. A preferred bottom contact conductive layer 26 typically has a thickness in the range of from two to six micrometers. In order to achieve such thicknesses it may be necessary to employ a two-step deposition technique made up of sputtering a first thin seed layer (up to about two micrometers) of conductive material onto the surface of the bottom contact adhesion layer 24. The final desired thickness of the bottom contact conductive layer 26 may be achieved by electroplating the conductive material onto the surface of the first seed layer of the conductive material.

A bottom contact metal layer 28 is deposited onto the surface of the bottom contact conductive layer 26 by using deposition techniques similar to those described for depositing the back side metal layer 22 onto the surface of the back side conductive layer 20. Preferably, the bottom contact metal layer is deposited by sputter deposition. The materials chosen for the bottom contact metal layer are the same as those chosen for the back side metal layer 22. A preferred bottom contact metal layer is chromium. A preferred bottom contact metal layer 28 has a thickness of approximately 0.02 micrometers.

Under appropriate circumstances, part or all of the back side metalization layer 21 and the bottom contact layer 25 may be deposited simultaneously instead of sequentially. Additionally, the order of deposition on the front and back sides of the substrate may be interchanged.

Figure 6:
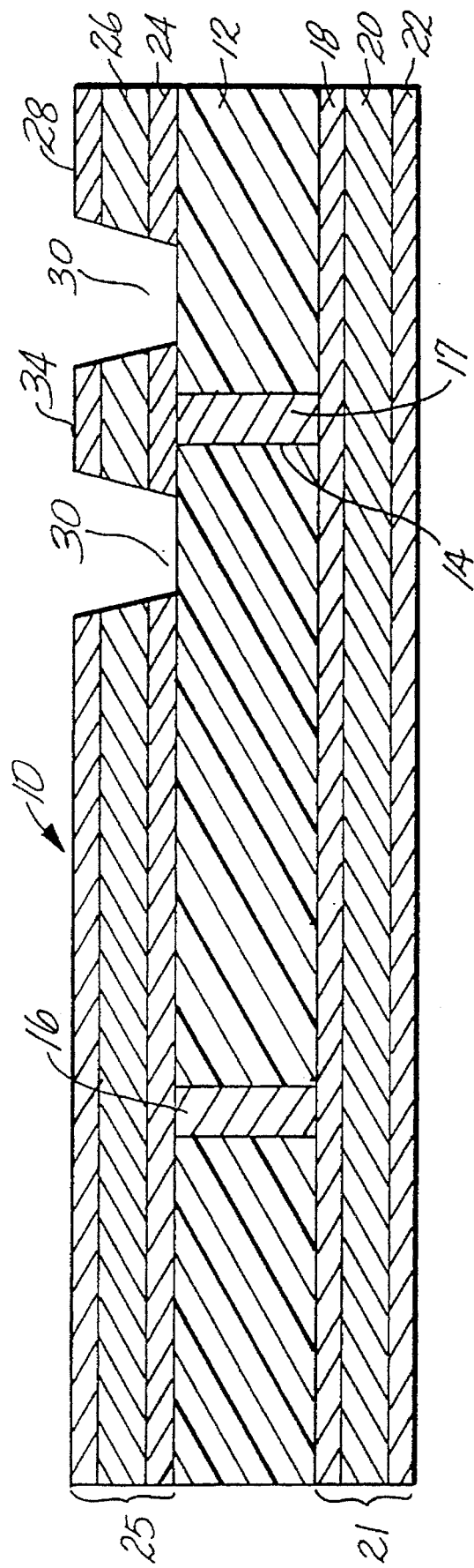

FIG. 6 shows the capacitor substrate 10 after a portion of the bottom contact layer 25 surrounding the power via has been selectively etched away to form a bottom contact power terminal 34. The removed portion of the bottom contact layer forms a bottom contact trench 30 surrounding the bottom contact power terminal that serves to physically and electrically separate the bottom contact power terminal 34 from the remaining portions of the bottom contact layer 25. The bottom contact power terminal 34 is electrically connected to a power via 17 which extends through the thickness of the base substrate 12 and electrically connects with the back side metalization layers 21. If already in place, a protective tape (not shown) is applied to the surface of the back side metal layer 22 to cover and protect it from acids and chemicals used during the front side etching operation. A preferred protective tape is manufactured by 3M and well known to those skilled in the art as "yellow" or "blue" tape. The etching operation may be carried out by using a selective etching technique well known to those skilled in the art such as reactive ion etching, chemical etching, dry etching, photo-litho-graphic etching and the like. A preferred selective etching technique is photo-litho-graphic etching.

Photo-litho-graphic etching the bottom contact layers to form the trench 30 is carried out by depositing photoresist material onto the surface of the bottom contact metal layer 28 in a pattern defining the location of the bottom contact power terminal 34. The pattern may be achieved by using a photo mask and the like. The bottom contact metal layer containing the photoresist is allowed to cure by soft baking and is subsequently exposed to light causing the photoresist to develop. After the photoresist is developed it is hard baked. The developed areas of the photoresist, which define the trench 30 is chemically etched to remove the bottom contact metal layer 28, the bottom contact conductive layer 26, and the bottom contact adhesion layer 24, exposing the top side surface of the base substrate 12. Any excess photoresist material remaining on the bottom contact metal layer 28 after the etching process is completed may be stripped away and the residue removed by using well know etching techniques such as short plasma etching and the like.

Figure 7:
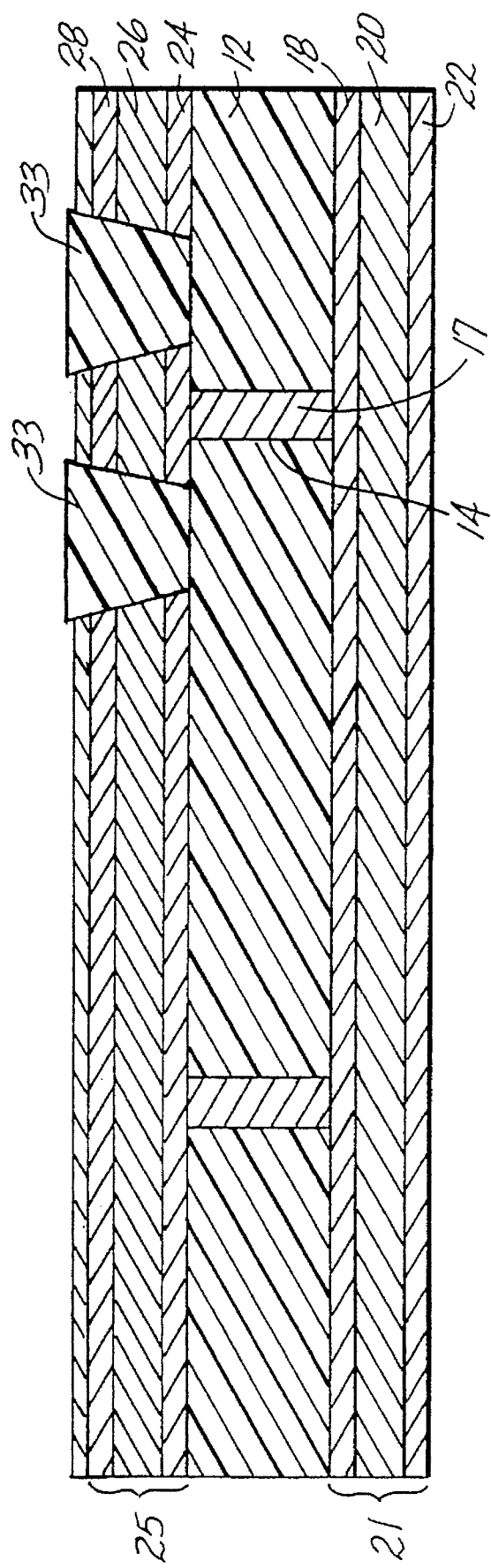

The bottom contact trench 30 is filled with a dielectric material forming an insulating plug 33 that encapsulates the bottom contact power terminal 34 and electrically isolates it from the remaining portions of the bottom contact layer 25, as shown in FIG. 7. Dielectric materials suitable for forming the insulating plug 33 may include polyimide, siloxane, bisdenzocyclobutene, photoresist or spin-on glass. The insulating plug can be formed by first depositing a layer of dielectric material onto the surface of the bottom contact metal layer 28 and into the bottom contact trench 30. If a non-photosensitive polyimide is used as the dielectric material, the polyimide may be deposited by using a spin-on technique and allowed to cure to form the final composition. The polyimide is patterned by using well known photo-lithographic techniques and then etched away at locations remote from the location of the insulating plug 33 by using a well known etching technique such as reactive ion etching and the like. The unetched portions of the photoresist, corresponding to the location of the insulating plug 33, are stripped away by well known conventional stripping techniques. If photoresist or photosensitive polyimide is used, the dielectric material may be applied by using the spin-on technique. The polyimide is patterned and then allowed to cure. Portions of the polyimide are then etched away, leaving the insulating plug in the trench.

The thickness of the dielectric material making up the insulating plug is dependent on the particular configuration of the underlying bottom contact layer and may be sufficient to eliminate any electrical short circuits on the sharp corners and sidewalls of the trench 30, as shown in FIG. 7. In the preferred embodiment, the thickness of each insulating plug 33 is slightly greater than the distance from the surface of the bottom contact metal layer 28 to the top side surface of the substrate 12 within each bottom contact trench 30, so that an end portion of each insulating plug extends a predetermined distance beyond the plane of the bottom contact metal layer 28. Additionally, the thickness of the insulating plug should account for shrinkage of the dielectric material during curing, if any.

The use of the insulating plug to fill the bottom contact trench is preferred over the method of electrically isolating the bottom contact power terminal by forming a dielectric insulating layer along the walls of the bottom contact trench because it avoids the sharp edges or corners between conductive and nonconductive members that may give rise to an electrical short circuit. Otherwise, the dielectric insulating material may be thinned at the sharp edge of the trench and expose the underlying metal.

FIG. 7 shows the capacitor substrate 10 after a bottom contact metalization layer 36 has been deposited onto the surface of both the bottom contact metal layer 28 and the insulating plug 33, and has been etched. A bottom contact metalization layer 36 is deposited onto the surface of the bottom contact metal layer 28 and the insulating plug 33 by using deposition techniques similar to those described for depositing the back side metalization layers and the bottom contact layers. A preferred method for depositing the bottom contact metalization layer is by sputter deposition. The material chosen for the bottom contact metalization layer 36 should be capable of forming a strong nonconductive oxide film having a relatively high dielectric constant. Suitable materials include tantalum, titanium, niobium, hafnium and the like. A preferred material for the bottom contact metalization layer 36 is tantalum. It is desired that the bottom contact metalization layer have a thickness less than the distance that each insulating plug extends beyond the plane of the bottom contact layer 25, as shown in FIG. 7. A preferred bottom contact metalization layer 36 has a thickness of approximately 0.5 micrometers.

The bottom contact metalization layer 36 is deposited after the bottom contact trench 30 has been filled by the insulating plug 33. After its deposition, the portion of the bottom contact metalization layer disposed on the surface of the insulating plug is removed by etching and the like, to electrically isolate the bottom contact power terminal 34 from the surrounding portions of the bottom contact layers 25.

The placement of the insulating plug 33 within the trench is important to the construction of the bypass capacitor because a capacitor in its simplest form comprises a pair of electrically conductive plates separated by a nonconducting insulating material. According to practice of this invention, a dielectric layer 38 will be formed at the surface of the bottom contact metalization layer 36 which will serve to electrically isolate subsequent top contact layers 45 (electrically conductive member) from the bottom contact layers (electrically conductive member), see FIGS. 7 through 10. The presence of the insulating plug 33 within the trench prevents the top and bottom contact layers from coming into electrical contact with each other at the trench walls, forming an electrical capacitor.

FIG. 8 shows the bypass capacitor substrate 10 after an insulating dielectric layer 38 has been formed on the surface of the bottom contact metalization layer 36. The dielectric layer is formed in such a manner that selected areas of the bottom contact metalization layer 36, directly above a ground via 16 and a power via 17, remain uncovered forming a ground metalization via 40 and a power metalization via 42, respectively. The dielectric layer 38 comprises an oxide film which may be formed by selectively oxidizing the bottom contact metalization layer 36 using oxidation techniques well known to those skilled in the art, such as by anodizing and the like.

A preferred dielectric layer 38 is formed by depositing a photoresist material onto the surface of the bottom contact metalization layer 36 at selected locations directly above a ground via 16 and a power via 17. The photoresist may be deposited using deposition techniques well known in the art such as by sputter deposition, chemical vapor deposition, plasma deposition and the like. The specific deposition of the photoresist onto select areas of the bottom contact metalization surface may be achieved by using a photo mask and the like. The bottom contact metalization layer containing the photoresist is allowed to cure by soft baking and is subsequently exposed to light causing the photoresist to develop. After the photoresist is developed it is hard baked.

The exposed surface of the bottom contact metalization layer is cleaned using methods well known to those skilled in the art such as vapor degreasing, solvent cleaning and the like. The bottom contact metalization layer is subjected to galvano-static anodizing, potentiostatic anodizing and is reverse biased to create an oxide film, which forms the dielectric layer 38 on the surface of the bottom contact metalization layer 36. The oxide film forming the dielectric layer does not, however, form on the surface portion of the bottom contact metalization layer covered with the photoresist material. The photoresist material is stripped away by short plasma etch and the like to uncover the non-oxidized bottom contact metalization surface forming a ground metalization via 40, located directly above the ground via 16, and a power metalization via 42, located directly above the power via 17, see FIG. 8.

In a preferred embodiment, the bottom contact metalization layer comprises tantalum (Ta) which, when anodized, forms tantalum pentoxide (Ta2O5), a strong non-conducting oxide film. Other suitable oxide films that may serve as the dielectric layer 38 include the oxidation products of titanium (titanium dioxide), niobium (niobium pentoxide) or hafnium (hafnium dioxide). A preferred dielectric layer 38 has a thickness in the range of from 0.1 to 0.2 micrometers.

FIG. 9 shows the bypass capacitor substrate 10 after a series of top contact layers 45 have been deposited onto the surface of the dielectric layer 38. The top contact layers 45 are the second electrically conductive member needed in the construction of the capacitor. The top contact layers comprise a top contact adhesion layer 44, a top contact conductive layer 46, and a top contact metal layer 48. A top contact adhesion layer 44 is deposited both onto the surface of the dielectric layer 38 and onto the portions of the bottom contact metalization layer 36 forming the ground metalization via 40 and the power metalization via 42. The top contact adhesion layer 44 is deposited by using deposition techniques similar to those described for the depositing the bottom contact adhesion layer 24. A preferred deposition technique being by sputter deposition. The material chosen for the top contact adhesion layer 44 may include titanium, tantalum, molybdenum and the like. A preferred material is titanium. A preferred top contact adhesion layer 24 has a thickness of approximately 0.2 micrometers. Like the bottom contact adhesion layer 24, the purpose of the top contact adhesion layer is to form a good interface with the dielectric layer 38 when a material such as copper is selected as the material for a top contact conductive layer.

A top contact conductive layer 46 is deposited onto the surface of the top contact adhesion layer 44 by using well known deposition techniques similar to those described for depositing the bottom contact conductive layer 26. Accordingly, the top contact conductive layer may be deposited by using a single deposition technique (i.e., when the desired thickness is less than about two micrometers) or it may be deposited by using a two-step deposition technique (i.e., when the desired thickness is greater than about two micrometers). The material chosen for the top contact conductive layer should have a high electrical conductivity. Suitable materials include metals and alloys of metals. A preferred material for the top contact conductive layer 46 is copper. A preferred top contact conductive layer has a thickness in the range of from two to six micrometers. The top contact conductive layer has a uniform thickness throughout. The surface of the conductive layer will be configured similar to that of the top contact adhesion layer 44, having slightly recessed portions corresponding to the recessed portions of the top contact adhesion layer filling both the ground metalization via and the power metalization via, as shown in FIG. 8.

A top contact metal layer 48 is deposited onto the surface of the top contact conductive layer 46 by using deposition techniques similar to those described for depositing the bottom contact metal layer 28. The material chosen for the top contact metal layer may be the same as that chosen for the bottom contact metal layer 28 and the back side metal layer 22. A preferred top contact metal layer is chromium. The top contact metal layer 28 typically has a thickness of approximately 0.02 micrometers.

FIG. 10 shows the bypass capacitor substrate 10 after a front side ground terminal 50 and a front side power terminal 60 have been formed in the top contact layers 45. The front side ground terminal 50 comprises a portion of the top contact layers 45 located directly above the ground metalization via 40 and ground via 16. The front side ground terminal is electrically isolated from the rest of the top contact layer by a ground terminal trench 52 formed by etching away the top contact layers to expose the surface of the dielectric layer 38. The ground terminal trench is formed by using a selective etching technique similar to that described for selectively etching the bottom contact trench 30 to form bottom contact power terminal 34. A preferred etching technique is by photo-litho-graphic etching. During the etching process the top contact layers 45 are etched completely through to the surface of the dielectric layer 38, as shown in FIG. 10. The location of the ground trench 52 serves to isolate the portion of the top contact layer, positioned directly over the ground metalization via 40 and ground via 16, from electrical connection with the portion of the top contact layers positioned directly over the power metalization via 42 and power via 17, forming a front side power terminal 60. Electrically isolating the front side ground terminal from the front side power terminal results in the formation of the capacitor in essentially all areas except the ground terminal.

The capacitor has the top contact layers 45, as one plate or electrode connected to the power lead. The other plate or electrode of the capacitor is the bottom contact layers 25 connected to the ground lead. The oxide layer 38 forms the dielectric of the capacitor. The insulating plug 33 avoids the need for the dielectric layer to descend along sidewalls of the trench isolating the power terminal and, thus eliminates need for the dielectric layer 38 to cross sharp corners at the edges of the trench.

The front side ground terminal 50 formed in this manner is electrically connected with the back side metalization layers 21 through the top contact layers, the ground metalization via 40, the bottom contact layers 25, and the ground via 16. Similarly, the front side power terminal 60 formed in this manner is electrically connected with the back side metalization layers 21 through the top contact layers, the power metalization via 42, the bottom contact power terminal 34, and the power via 17.

Figure 11:
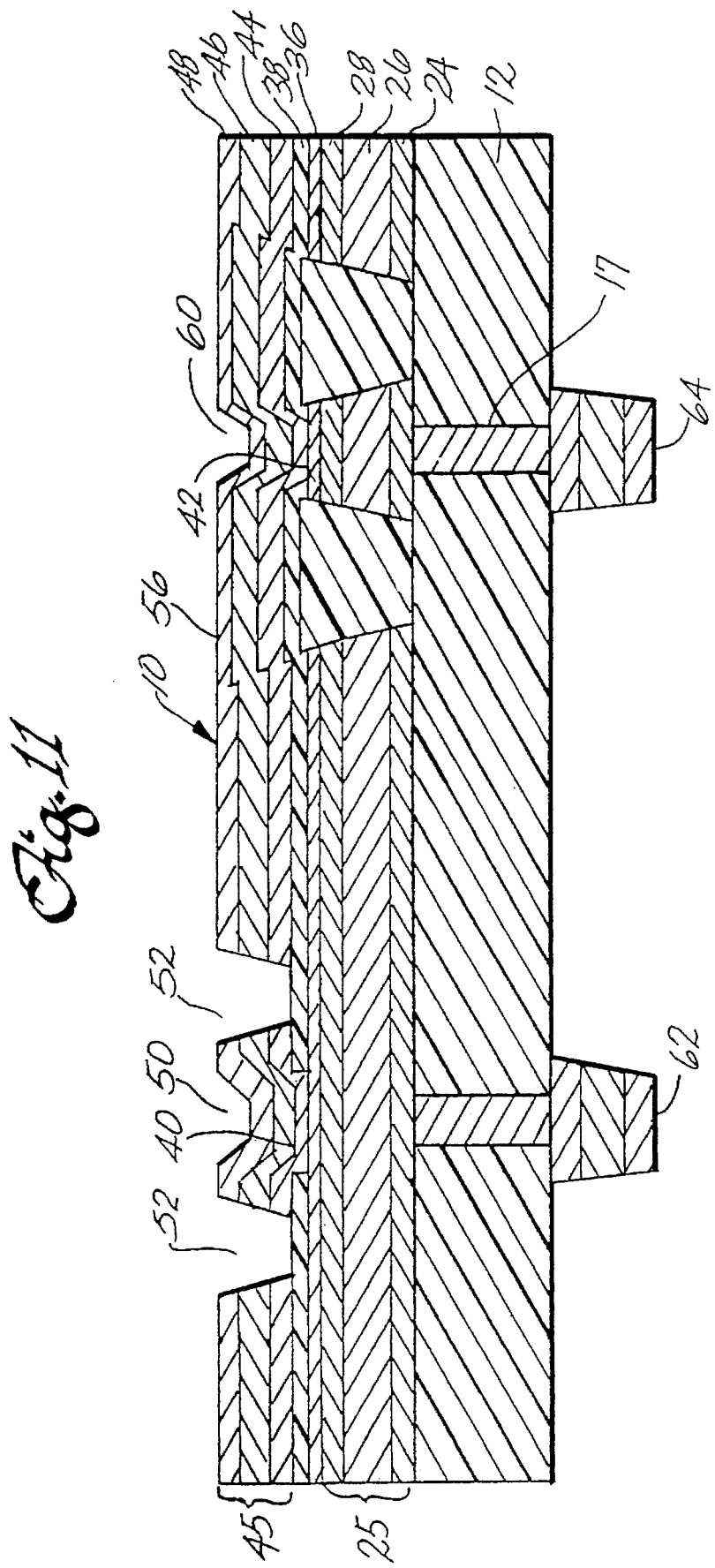

FIG. 11 shows the bypass capacitor substrate 10 after the back side metalization layers 21 have been etched to form a back side ground terminal 62 and a back side power terminal 64 to facilitate electrical connection with a printed circuit board and the like. The back side metalization layers are etched by using a selective etching technique similar to that described for etching the bottom and top contact conductive layers, such as reactive ion etching, dry etching, chemical etching, photo-litho-graphic etching and the like. A preferred technique for forming the back side ground terminal and back side power terminal is by using a photo-litho-graphic etch technique. The back side metalization layers comprising the back side adhesion layer 18, back side conductive layer 20, and back side metal layer 22 are removed from the back side surface of the base substrate except at two locations. The back side metalization layers remain intact at one location directly beneath the ground via 16, forming the back side ground terminal 62, and at a second location directly beneath the power via 17, forming the back side power terminal 64. Before etching the back side metalization layers, the surface of the top contact metal layer 48 is protected from exposure to acids and chemicals used for etching by methods well known to those skilled in the art, such as by coating the surface with grease, yellow or blue tape and the like.

Figure 12:
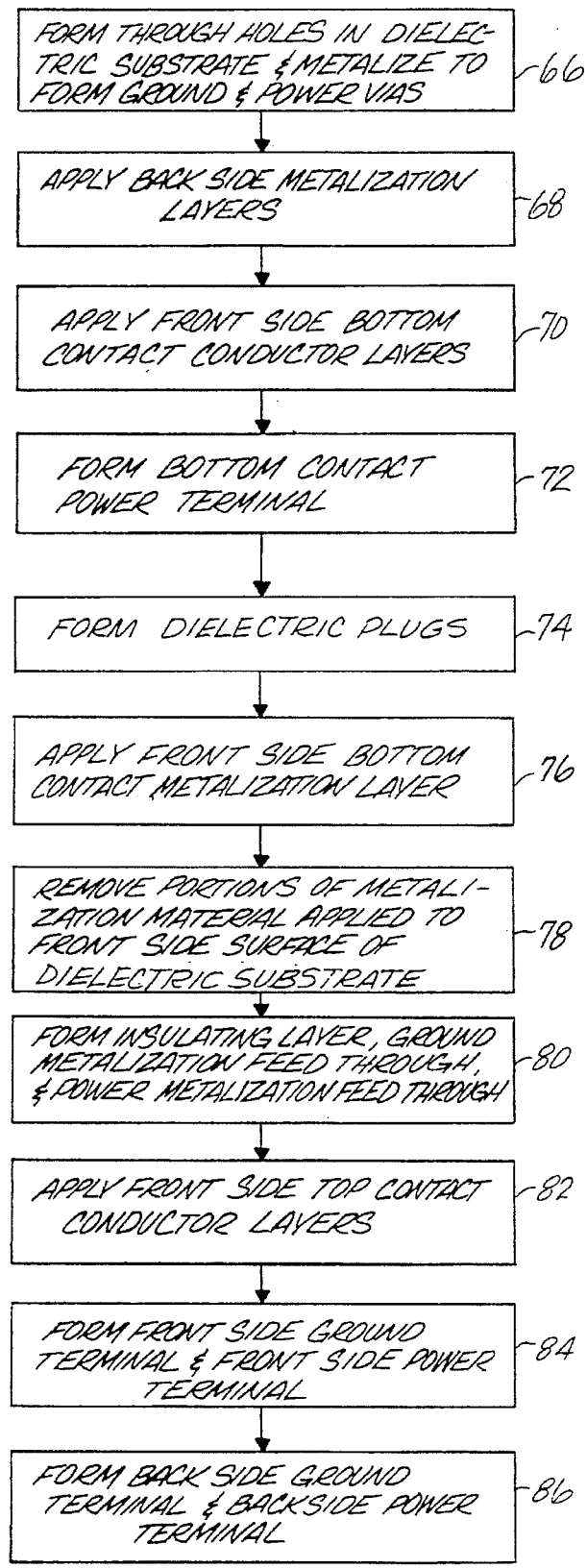
FIG. 12 is a flow chart summarizing the steps employed in the method of fabricating a preferred embodiment of the thin-film bypass capacitor according to the practice of this invention.

FIG. 12 is a flow chart summarizing the step wise method of manufacturing a preferred embodiment of the thin-film capacitor according to the practice of the present invention. In summary, a plurality of through holes are formed in the dielectric substrate and metalized to form ground and power vias (step 66), back side metalization layers are applied to the back side of the dielectric substrate (step 68), bottom contact conductor layers are applied to the front side of the dielectric substrate (step 70), a bottom contact power terminal is formed in the bottom contact conductor layers (step 72), a insulating plug is formed in the bottom contact conductor layers to electrically isolate a bottom contact power terminal from the remaining portion of the bottom contact conductor layers (step 74), a front side metalization layer is applied to the surface of the bottom contact conductor layers and the insulating plug (step 76), the metalization layer applied to the surface of the insulating plug is removed (step 78), form the dielectric layer, ground metalization via, and power metalization via (step 80), apply top contact conductor layers to the surface of the dielectric layer (step 82), form a front side ground terminal and a front side power terminal in the top contact conductor layers (step 84), form a back side ground terminal and a back side power terminal in the back side metalization layers (step 86).

It is to be understood that although only one exemplary embodiment of the thin-film capacitor and one method for manufacturing the same has been described and illustrated herein, many variations will be apparent to those skilled in the art. For example, the method for manufacturing a thin-film capacitor according to the present invention may be used to fabricate bypass capacitors configured differently than the preferred embodiment. A plurality of bypass capacitors may be arranged having a plurality of ground vias and power vias and their respective ground and power terminals, all on a single substrate.

The bypass capacitor of the present invention may also be fabricated having a back side metalization layer 21 comprising only a back side adhesion layer and a back side conductive layer. Instead of using copper for the back side conductive layer, gold may be selected as the conductive metal to be deposited onto the surface of the back side adhesion layer. The physical properties of gold allow it to remain affixed to the back side adhesion layer during successive front side etching operations without the need for depositing a subsequent protective back side metal layer. The gold material may be deposited by using the same deposition techniques described for depositing the back side conductive layer in the preferred embodiment. A preferred thickness of the gold back side conductive layer is approximately one micrometer. The back side metalization layers of this embodiment may be etched in the same manner as the back side metalization layers in the preferred embodiment in order to create the back side ground terminal 62 and back side power terminal 64 illustrated in FIG. 11.

The bypass capacitor of the present invention may be fabricated by using an alternate method for forming the dielectric layer 38, avoiding the need for applying a bottom contact metalization layer 36. Far example, the dielectric layer 38 may be formed by depositing a thickness of the desired oxide material directly onto the surface of the bottom contact metal layer 28 and the insulating plug 33 using well known deposition techniques such as sputter deposition, chemical vapor deposition, plasma deposition and the like. The desired dielectric layer material may also be formed by depositing a liquid sol-gel solution onto the surface of the bottom contact metal layer 28 and the insulating plug 33 by spin-on deposition or spray-on deposition techniques well known in the art. The sol-gel solution applied in this manner subsequently undergoes a soft and then a high temperature baking to form the final desired insulating oxide.

The dielectric layer 38 applied according to this alternative embodiment would subsequently be subjected to a selective etching process to form the ground metalization via 40 and power metalization via 42 at locations directly above the ground via 16 and power via 17, respectively. The dielectric layer may be etched by using well known selective etching techniques such as photo-litho-graphic etching described in fabricating the preferred embodiment.

Although the capacitor according to present invention is described in the context of a thin-film bypass capacitor, thin-film capacitors other than bypass capacitors may also be configured according to the present invention and are, therefore, understood to be within the scope of the invention.

Since many such variations may be made, it is to be understood that within the scope of the following claims, this invention may be practiced otherwise than specifically described.

What is claimed is:

1. A method for forming a thin-film capacitor comprising the steps of:

forming a plurality of conductive power and ground vias through a nonconductive substrate;

forming a power electrical terminal on a back side of the substrate in contact with one or more of the power vias;

forming a ground electrical terminal on a back side of the substrate in contact with one or more of the ground vias;

depositing a bottom contact layer on the front side of the substrate in electrical contact with one or more of each of the power and ground vias;

forming a bottom contact power terminal by removing a portion of the bottom contact layer that is not adjacent to one or more of the power vias;

filling the removed portions of the bottom contact layer with a dielectric material to form one or more insulating plugs;

forming a dielectric layer over a portion of the insulating plugs and over a portion of the bottom contact layer which is not adjacent to the bottom contact power terminal, and which is not adjacent to one or more ground via in electrical contact with the ground electrical terminal;

forming a front side ground terminal by leaving an opening through the dielectric layer at a location above one or more ground via in electrical contact with the back side ground electrical terminal;

forming a front side power terminal by leaving an opening through the dielectric layer at a location above one or more power via in electrical contact with the back side electrical power terminal;

depositing a top contact layer over the dielectric layer and the openings in the dielectric layer; and electrically isolating the front side ground terminal from the front side power terminal by removing a portion of the top contact layer not adjacent to one or more ground via in electrical contact with the back side ground terminal.

2. The method as recited in claim 1 comprising forming the power terminal and ground terminal on the back side of the substrate by:

depositing a back side metalization layer onto the back side surface of the substrate; and removing portions of the back side metalization layer that are not adjacent to one or more of the power and ground vias, respectively.

3. The method as recited in claim 1 comprising forming the dielectric layer by oxidizing a portion of the surface of the bottom contact layer.

4. The method as recited in claim 1 comprising forming the dielectric layer by depositing a dielectric material onto selected portions of the bottom contact layer surface.

* * * * *